United States Patent
Conti et al.

(10) Patent No.: US 7,265,561 B2
(45) Date of Patent: Sep. 4, 2007

(54) DEVICE BURN IN UTILIZING VOLTAGE CONTROL

(75) Inventors: Dennis R. Conti, Essex Junction, VT (US); Roger Gamache, Essex Junction, VT (US); David L. Gardell, Fairfax, VT (US); Marc D. Knox, Hinesburg, VT (US); Jody J Van Horn, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 318 days.

(21) Appl. No.: 10/605,449

(22) Filed: Sep. 30, 2003

(65) Prior Publication Data

US 2005/0068053 A1    Mar. 31, 2005

(51) Int. Cl.
*G01R 31/02* (2006.01)
(52) U.S. Cl. ........................................ 324/754
(58) Field of Classification Search ............... 324/760, 324/765, 755; 165/80.3–80.4, 104.13; 361/700, 361/704, 718, 699
See application file for complete search history.

(56) References Cited

U.S. PATENT DOCUMENTS

| | | | |
|---|---|---|---|
| 4,567,652 A * | 2/1986 | Gussman et al. ............. | 29/837 |
| 4,584,764 A * | 4/1986 | Gussman ..................... | 29/705 |
| 4,881,591 A | 11/1989 | Rignall | |
| 5,030,905 A | 7/1991 | Figal | |
| 5,072,175 A | 12/1991 | Marek | |
| 5,086,271 A | 2/1992 | Haill et al. | |
| 5,204,618 A * | 4/1993 | Matsuoka ................. | 324/158.1 |
| 5,414,370 A | 5/1995 | Hashinaga et al. | |
| 5,473,259 A | 12/1995 | Takeda | |
| 5,519,333 A | 5/1996 | Righter | |
| 5,568,054 A * | 10/1996 | Iino et al. .................... | 324/760 |
| 5,911,897 A * | 6/1999 | Hamilton ..................... | 324/755 |
| 6,229,325 B1 | 5/2001 | Browning et al. | |
| 6,323,665 B1 * | 11/2001 | Johnson et al. ............. | 324/760 |
| 6,326,800 B1 | 12/2001 | Kirihata | |
| 6,504,392 B2 | 1/2003 | Fredeman et al. | |
| 6,512,392 B2 | 1/2003 | Fleury et al. | |
| 6,518,746 B2 | 2/2003 | McClure | |
| 6,535,824 B1 | 3/2003 | Mansky et al. | |
| 6,577,146 B2 | 6/2003 | Gamache | |
| 6,590,404 B2 * | 7/2003 | Gardell et al. .............. | 324/755 |
| 6,744,269 B1 * | 6/2004 | Johnson et al. ............. | 324/760 |
| 6,815,966 B1 * | 11/2004 | Gunn et al. .................. | 324/760 |
| 2004/0232933 A1 * | 11/2004 | Maesaki et al. ............ | 324/760 |

* cited by examiner

*Primary Examiner*—Jermele Hollington
(74) *Attorney, Agent, or Firm*—William N. Hogg; Driggs, Hogg & Fry Co., LPA

(57) ABSTRACT

According to the present invention, a method of controlling the burning in of at least one I/C device in a burn in tool is provided. For high power device, the tool has a heat sink positioned to contact each device being burned in, and has a socket for mounting each device to be burned in, and a power source to supply electrical current to burn in each device. The method includes the steps of continuously monitoring at least one process parameter selected from the group of current, voltage, power and temperature, and varying the voltage to maintain at least one of the parameters at or below a given value. Also, a technique for burning in low power devices without a heat sink is provided. The invention also contemplates a tool for performing the above method.

12 Claims, 1 Drawing Sheet

DEVICE BURN IN UTILIZING VOLTAGE CONTROL

BACKGROUND OF INVENTION

1. Field of the Invention

This invention relates generally to burn in of I/C chips or similar devices, and more particularly to I/C chip burn in utilizing voltage control responsive to some measured value relating to the power and/or temperature of the chip being burned in.

2. Background Information

According to conventional prior art practice, electronic devices, such as I/C chips, often need to be burned in before use at increased voltages and/or temperatures which accelerates early life failures, thus increasing product reliability. Conventional techniques for temperature control during burn in depend on the power generated by the I/C device during burn in. For low powered devices, the temperature of the fluid flowing around the parts is controlled. For medium power devices, each device is contacted by a heat sink. For high power devices, fluid flow, and/or heaters within each heat sink, are controlled by a microprocessor to maintain each device at the desired burn in temperature (typically 120° C. or 140° C.). According to conventional practice, a plurality of devices are burned in at the same time by applying the same voltage and stimulation patterns to each device, and controlling the temperature as indicated above. An example of a commercially available burn in tool that operates by controlling the temperature of the heat sink for each device is the MCC model HPB 2 manufactured by Micro Control Company of Minneapolis, Minn., USA. The major advantage to the prior art is in massively parallel burn in. There are hundreds or even thousands of devices burned in at the same time using the same temperatures, voltages and patterns. Parallel burn in is desired because each part may need to be burned in for tens of hours.

There are some major limitations to burn in of high power devices. Generally, the tool will have a limited amount of current that can be applied to each device. For example, there may be an individual 50 amp power supply for each device in the tool. Another limitation is a limited ability of the tool to remove the resulting heat from each part. For example, the tool may use liquid cooled heat sinks. If the liquid is 20° C., the burn in temperature is 140° C. and the thermal resistance from the liquid through the heat sink to the device is 1.2 C/W, then the maximum power that can be removed is (140−20)/1.2=100 Watts.

There are some major challenges and drawbacks to direct temperature control during high power burn in. One drawback is that higher voltages and temperature levels during burn in can result in power dissipation levels that are higher than would be seen by the devices at normal operating temperatures and power densities which will overload the capacity of the tool. Another problem is that there may be large power variations from device to device, even in devices from the same wafer, e.g. at the same voltage, one device may operate at two to three times higher power than a second device, which drives the need to individually control the temperature of each heat sink. In a related problem, with the prior art technique, it is common for some of the devices being burned in to exceed the current or power limits of the tool, which results in the power to each such device being interrupted by either a fuse or circuit breaker, or by just turning off the power with the appropriate software. These devices do not receive the required burn in, resulting in reduced yield and tool productivity. One conventional solution to this problem is to reduce the voltage that is applied to all parts in the tool until substantially all the parts in the tool are below the current and power limits. The problem is that when the voltage level is reduced, the devices must be burned in for an even longer time to obtain the same overall population reliability. With conventional tooling, it is sometimes necessary to sort devices into groups according to their power or current and burn in each group at a different voltage and duration. Regardless, in conventional tooling, there is invariably a large percentage of devices in each tool that are operating at currents and powers significantly below the tool limits. Thus, burn in duration must be extended. Therefore, it is desired to control burn in to overcome these problems.

SUMMARY OF INVENTION

According to the present invention, a method of controlling the burning in of at least one I/C device in a burn in tool is provided. For high power parts, the tool has a heat sink positioned to contact each device being burned in, and has a socket for making temporary electrical contact to each device, a power source to supply electrical current to burn in each device, and a monitor to continuously monitor the current supplied to each device. The method includes the steps of continuously monitoring the current, temperature and/or power of each device and varying the voltage to maintain at least one of the values at or below a given value. Each device in the tool is thus burned in at the highest possible voltage (without exceeding current or power limits of the tool). Each device obtains the maximum possible burn in without resorting to sorting. Also, a technique for burning in low power devices without a heat sink is provided. The invention also contemplates a tool for performing the above method.

BRIEF DESCRIPTION OF DRAWINGS

FIG. 1 is a perspective diagrammatic view of a burn in board having a plurality of sockets for securing devices therein for burn in.

DETAILED DESCRIPTION

Figure 1:
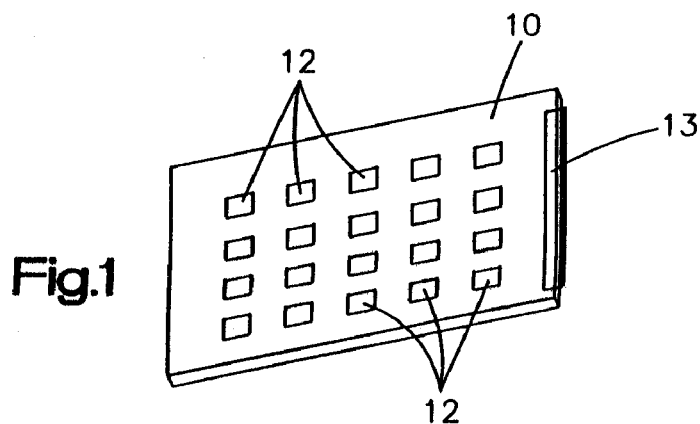
Figure 2:
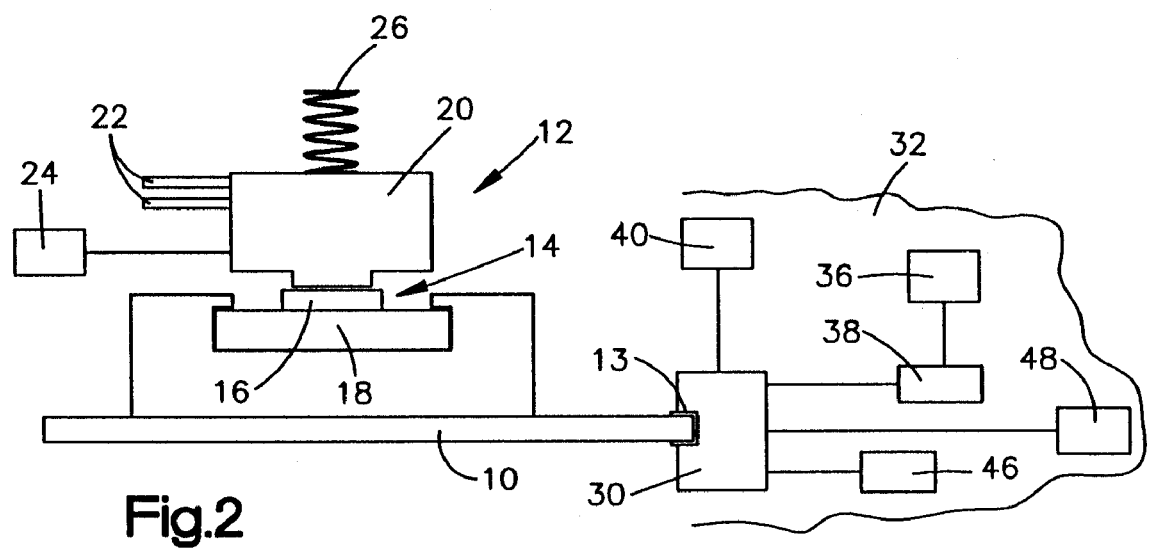
FIG. 2 is a detailed longitudinal sectional view, somewhat diagrammatic, of one of the sockets of FIG. 1.

Referring now to FIG. 1, a burn in board 10 having a plurality of socket assemblies 12 is shown. The burn in board 10 includes an edge connector 13 for making electrical contact to the burn in tool. Referring now to FIG. 2, a single burn in socket assembly 12 on a small section of burn in board of FIG. 1 is shown. Each socket assembly 12 is configured to hold a device 14 for burn in. Conventionally, in one embodiment, each device 14 is comprised of a semiconductor chip 16 mounted to a ceramic substrate 18.

Each socket 12 includes a heat sink 20 having internal cooling and heating channels (not shown) and incorporating water inlets and outlets 22, a chip temperature sensor 24 and spring 26 for urging the heat sink 20 into direct temporary contact with the chip 16. The device 14 is mounted in a burn in socket assembly 12. The burn in board has edge connector 13 which mates to electrical connector 30 in burn in tool 32.

The burn in tool 32 includes various electrical inputs to the burn in board 10 through connectors 13 and 30. The electrical inputs include a power supply 36 which supplies current through current meter 38 to connector 30, and voltage monitor or volt meter 40 which monitors the voltage applied to the chip 16 or socket assembly 12. There are generally additional inputs 46 and 48 for applying signals and evaluating results. Electrical stimulus is typically in the form of test signals which interface to the test circuitry of the chip. Electrical stimulus is intended to provide in-situ test and monitor capabilities as well as chip initialization and stress pattern execution.

Figure 3:
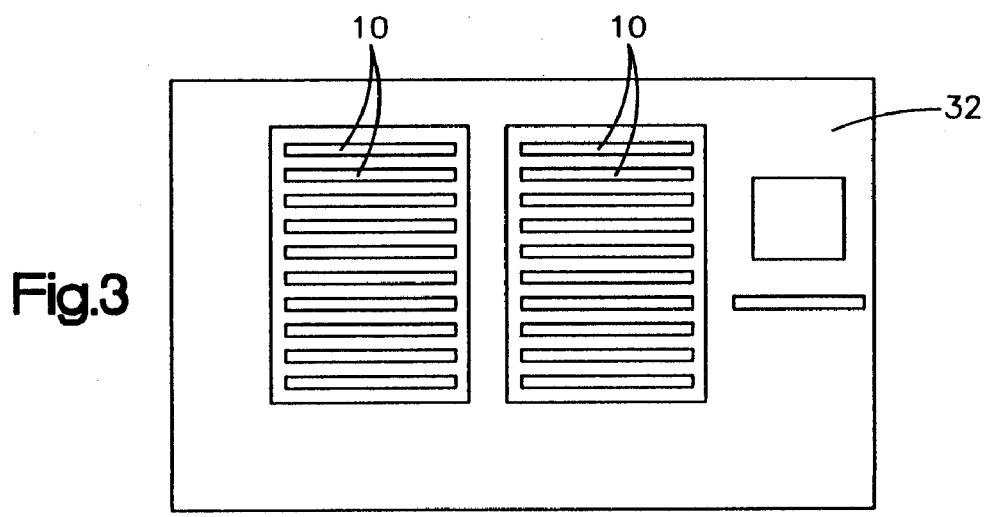
FIG. 3 is a front elevational view of a burn in tool having a plurality of burn in boards therein.

FIG. 3 shows diagrammatically several burn in boards 10 contained in a burn in tool 32.

According to the present invention, there are four process parameters that can be monitored. The parameters are voltage, current, power and temperature. The voltage applied to each device is monitored by volt meter 40 and continuously varied to maintain some combination of the parameters at or below desired values. Each device is thus at an optimum voltage level which is not necessarily the same as any other device which is being burned in. Current supplied to the device is measured with the current meter 38. Power is calculated from the applied voltage multiplied by the current. Voltage is ideally measured at the chip but may alternately be measured at the socket, burn in board or power supply.

In one embodiment, the power of all devices 14 is maintained at a predetermined value. The tool then applies the same amount of cooling to each device 14 and they will all be at the same temperature. For low power devices, temperature control may be by forced convection air flow over the device in the socket, no heat sink being required. No individual chip temperature measurement or control is required. The limitation of this embodiment is that, as power levels continue to increase, small differences in cooling efficiency from one device to the next will result in significant temperature gradients across the devices in the tool. For higher power devices, air or liquid cooled heat sinks 20 are used with a constant air or fluid temperature and flow rate.

In the preferred embodiment, the temperature of each device 14 is monitored by means well known in the prior art, including a small spring loaded RTD or thermocouple 24, or by utilizing temperature sensitive circuitry within the device, such as diodes, resistors or oscillators. The temperature of each device is controlled by individually controlling the temperature of each heat sink responsive to the temperature sensor 24. The techniques for this are well known. Heaters can be added to the heat sinks and the fluid or air flow through the heat sink can be controlled to maintain the device at the desired set point temperature. The voltage to each device is adjusted to provide the optimum burn in. The voltage will be adjusted based on input from a variety of sources; for example, is the cooling fluid flow near maximum?—is the power within predetermined limits?—is the current high enough to indicate a functional product but below the level that would indicate a shorted device or socket?—does the input from the patterns indicate burn in should continue?—etc.

In the preferred embodiment, the tool records the voltages applied to each device. Subsequent to burn in, devices may be sorted based on the results. For example, devices with voltages within some range will have acceptable reliability; devices with voltages outside this range may be unsuitable for sale.

According to the present invention, all devices are burned in at the highest possible voltage (at the current or power limit of the tool), so that the overall reliability of the population of parts is increased without increasing burn in durations. The advantages of the invention will be recognized in all types of burn in tooling. For example, some existing burn in tools for low powered devices rely on convective cooling across the bare surface of the device. The current limit may be less than 1 amp per device. Future tools for super high power burn in will have advanced high performance heat sinks and high current power supplies and will be able to supply 400 amps per device and remove up to 600 watts. Some burn in tools have multiple devices on each board and other tools burn in only one part at a time.

The invention claimed is:

1. A method of controlling the burning in of at least one I/C chip in a burn in tool, wherein said tool has a device for mounting each chip to be burned in, a power source to supply electrical current individually to burn in each chip, and a monitor for each chip to continuously monitor the temperature value of each chip, comprising the steps of:
    continuously monitoring at least one electrical value input to each chip selected from the group of current, voltage and power, and varying the voltage to each chip to maintain at least one of the values at or below a given value.

2. The method of claim 1 wherein the voltage at each chip is varied to maintain the current value below a given value.

3. The method of claim 1 wherein the voltage at each chip is varied to maintain the power value below a given value.

4. The method of claim 1 wherein each device temperature is monitored individually and the voltage to each device is individually varied to maintain the device at a given temperature.

5. The method of claim 1 where there is a heat sink in contact with the chip.

6. The method of claim 5 wherein the chip temperature of each chip is monitored and the temperature of the heat sink is varied to maintain the device temperature at a given value.

7. A burn in tool for burning in at least one I/C chip comprising:
    a structure for mounting each chip to be burned in individually;
    a power source to supply electrical current individually to burn in each chip;
    a structure with each chip to continuously monitoring at least one electrical value input of each chip individually selected from the group of current, voltage and power, and
    a structure to vary the voltage to maintain at least one of the values of each chip at or below a given value.

8. The tool of claim 7 wherein the voltage is varied to maintain the current value at each chip below a given value.

9. The tool of claim 5 wherein the voltage is varied to maintain the power value at each chip below a given value.

10. The tool of claim 7 including a monitor to continuously monitor the temperature value of each chip individually being burned in and wherein the voltage is varied to maintain the temperature value of each chip individually at a given value.

11. The tool of claim 7 wherein a heat sink is in contact with each chip.

12. The tool of claim 7 wherein the tool has a heat sink and temperature monitor for each chip and each heat sink has means to control the temperature of the heat sink, and the temperature control means is varied to maintain the temperature value of each chip at a given value.

\* \* \* \* \*